(12) United States Patent
Nishimura

(10) Patent No.: US 7,242,029 B2
(45) Date of Patent: Jul. 10, 2007

(54) LIGHT EMITTING DEVICE

(75) Inventor: Tomoyoshi Nishimura, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 372 days.

(21) Appl. No.: 11/033,719

(22) Filed: Jan. 13, 2005

(65) Prior Publication Data
US 2005/0151143 A1    Jul. 14, 2005

(30) Foreign Application Priority Data
Jan. 13, 2004   (JP)  .............. 2004-005949

(51) Int. Cl.
*H01L 33/00* (2006.01)
(52) U.S. Cl. ............... 257/88; 257/79; 257/84; 257/89; 257/92; 257/93; 257/99
(58) Field of Classification Search ............. None
See application file for complete search history.

(56) References Cited
U.S. PATENT DOCUMENTS
4,975,729 A * 12/1990 Gordon ............... 355/1

6,137,593 A * 10/2000 Venkateswar et al. ....... 358/1.8

FOREIGN PATENT DOCUMENTS
JP    2003-145812 A    5/2003

* cited by examiner

Primary Examiner—Wai-Sing Louie
(74) Attorney, Agent, or Firm—Sughrue Mion, PLLC

(57) ABSTRACT

A light emitting element array is made with large light emitting elements and small light emitting elements are arranged on a substrate in a matrix-like form. The large light emitting element has the luminescent area of about 1 mm square. There is a clearance N1 of about 0.5 mm between the large light emitting elements. The small light emitting element has the luminescent area of about 0.5 mm square, and each small light emitting element is disposed at a position corresponding to each clearance N1 in the scanning direction. Because the large light emitting elements and the small light emitting elements do not overlap each other in the scanning direction, even if the light emitting element array comes close to a thermosensitive recording paper, there becomes no uneven distribution of light quantity of the light emitting element array in the scanning direction.

13 Claims, 6 Drawing Sheets

LIGHT EMITTING DEVICE

BACKGROUND OF THE INVENTION

1. Field of the Invention

The present invention relates to a light emitting device including a light emitting element array on which plural light emitting elements are arranged, and emitting light toward a photosensitive material moving relative to the light emitting element array.

2. Description Related to the Prior Art

An optical fixing unit for a thermal printer is known as the light emitting device to emit light toward the photosensitive material. The optical fixing unit emits fixing light toward a thermosensitive recording paper, on which an image is thermally recorded by a thermal head, to optically fix thermosensitive coloring layers. The optical fixing unit is disposed on a conveyer passage, and emits the fixing light toward a whole recording surface of the thermosensitive recording paper on passage in a sub scanning direction. To optically fix the whole recording surface evenly, distribution of light quantity of the optical fixing unit should be uniformed in a scanning direction (a width direction of the recording paper).

As disclosed in Laid-Open Japanese Patent Application 2003-145812, a light emitting element array on which plural light emitting elements (for example LEDs) are arranged is known as a light source of the optical fixing unit. To uniform the light quantity distribution of the light emitting element array, it is ideal to arrange the light emitting elements with no clearance between each of elements. However, in practice, there is a need to make a clearance between the adjacent light emitting elements, for connection between wiring patterns of a circuit board and the each light emitting element, and so on. An uneven light quantity distribution occurs by these clearances. The unevenness of the light quantity distribution is compensated by diffusion of the light when a clearance between a luminescent surface of the light emitting element array and the recording surface of the thermosensitive recording paper is widened. However, if the clearance becomes wider, illumination efficiency and energy efficiency become worse, and illumination intensity is further reduced by the diffusion of the light. According to this, longer time is required for the fixation.

In Laid-Open Japanese Patent Application 2003-145812, a light emitting element array 100 as shown in FIG. 6 is described. In the light emitting element array 100, light emitting elements 102, 104 having width of about 1 mm are arranged to form a first element line and a second element line along the scanning direction, respectively. Each light emitting element is arranged in a zigzag form, such that the each light emitting element 104 in the second element line is disposed at a position corresponds to each clearance N1 (about 0.5 mm), which is formed between the adjacent light emitting elements 102 in the first element line, in the scanning direction. According to this arrangement, an experiment shows that even if a clearance L between the luminescent surface of a light emitting element array 100 and a recording surface of the thermosensitive recording paper 106 became about 20 mm, even distribution of light quantity in the scanning direction was maintained.

If the clearance L becomes narrower, the illumination efficiency and the energy efficiency become more enhanced. However, by the above arrangement, if the clearance L becomes narrower than 20 mm (for example about 10 mm), the uneven light quantity distribution occurs at positions where the light emitting elements 102 in the first element line and the light emitting elements 104 in the second element line overlap each other in the scanning direction.

SUMMARY OF THE INVENTION

An object of the present invention is to provide a light emitting device which maintains even light quantity distribution in a scanning direction even if a luminescent surface is closer to an irradiated surface of a photosensitive material.

In order to achieve the above object, a light emitting device of the present invention comprises a light emitting element array including at least one main luminous line on which plural large light emitting elements having large luminescent surface are arranged in one line along a first direction, and a sub luminous section having at least one small light emitting element having smaller luminescent surface than the large light emitting element and being disposed close to the main luminous line, at a position corresponding to a clearance between the large light emitting elements in the first direction. The length of the sub luminous section is approximately equal to the length of the clearance in the first direction.

In another embodiment of the light emitting device of the present invention, plural arranged light emitting elements are treated as a light emitting element module. This light emitting device comprises a light emitting element array including at least one main luminous line, on which plural large light emitting element modules including plural light emitting elements arranged therein to be large in luminescent area are arranged as one line along the first direction, and a sub luminous section having at least one small light emitting element module including plural light emitting elements arranged therein to be smaller in luminescent area than the large light emitting element module and being disposed close to the main luminous line, at a position corresponding to a clearance between the large light emitting element modules in the first direction. The length of the sub luminous section is approximately equal to the length of the clearance in the first direction.

According to the present invention, the sub luminous section having at least one small light emitting element or one small light emitting element module is disposed close to the main luminous line on which the plural large light emitting elements or the plural large light emitting element modules are arranged along the scanning direction so that it goes into position to correspond to the clearance between the large light emitting elements or the large light emitting element modules in the scanning direction. Therefore, portions where the light emitting elements overlap each other in the scanning direction become smaller than the conventional arrangement of the light emitting elements to put the light emitting elements of same size in a zigzag. Accordingly, the even light quantity distribution in the scanning direction can be maintained even if the luminescent surface is closer to the irradiated surface of the photosensitive material. Therefore, time for fixation can become short because illumination efficiency and energy efficiency can be enhanced, and illumination intensity is increased.

BRIEF DESCRIPTION OF THE DRAWINGS

The above objects and advantages of the present invention will become easily understood by one of ordinary skill in the art when the following detailed description would be read in connection with the accompanying drawings:

FIG. 3 is an explanatory illustration showing a light emitting element array for yellow.

FIG. 5 is an explanatory illustration showing light emitting element arrays in which sub luminous section consists of plural small light emitting elements or plural small light emitting element modules.

FIG. 6 is an explanatory illustration showing a light emitting element array of the prior art.

PREFERRED EMBODIMENTS OF THE INVENTION

Figure 1:
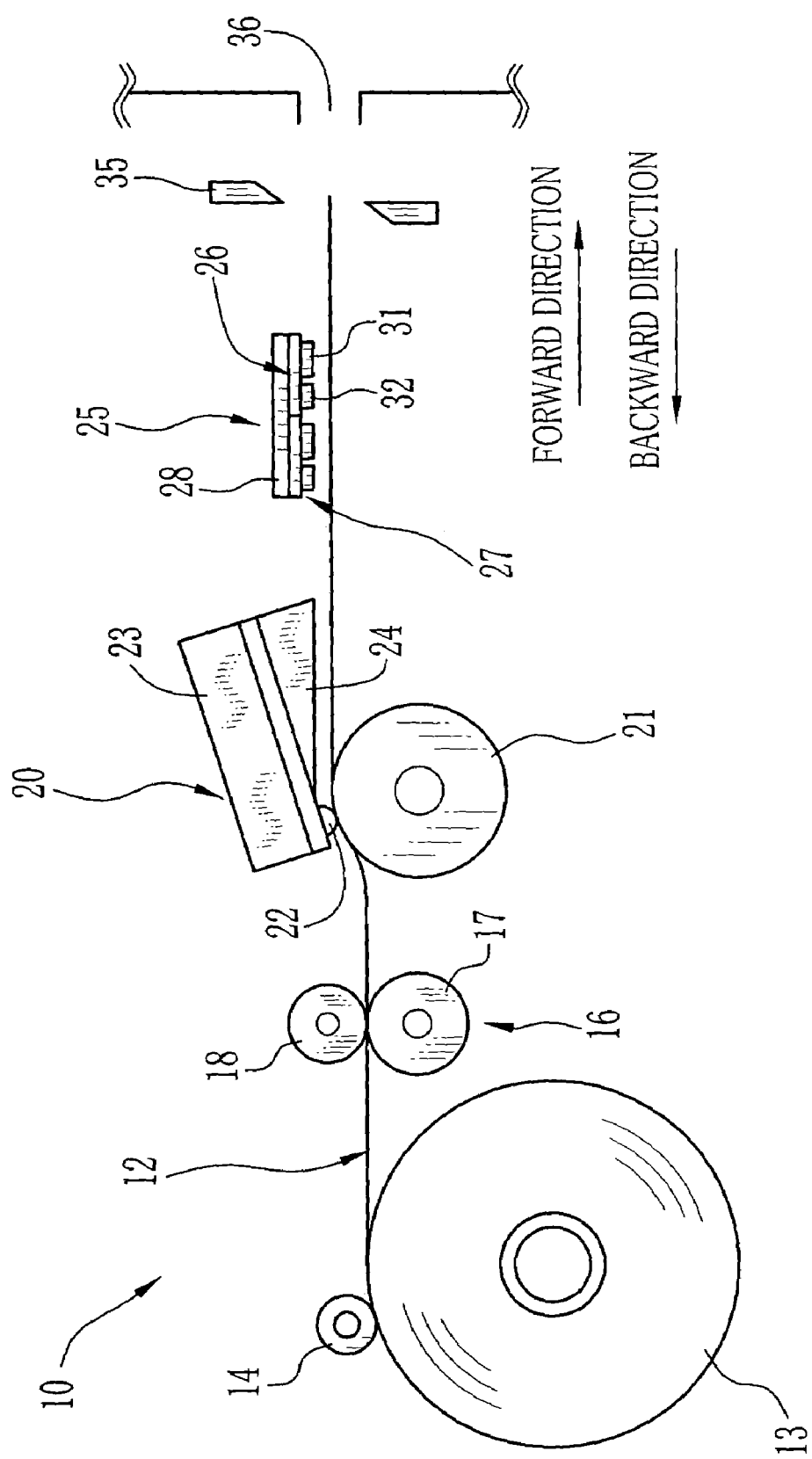
FIG. 1 is a schematic illustration showing a structure of a thermal printer having an optical fixing unit of the present invention.

As shown in FIG. 1, a thermal printer 10 is loaded with a long thermosensitive recording paper 12 being wound into a roll 13. The thermal printer 10 draws the recording paper 12 from the roll 13, and feeds the recording paper 12 in a sub scanning direction which is perpendicular to a width direction of the recording paper 12, for printing an image. After the printing, the thermosensitive recording paper 12 on which the image is printed is cut into a predetermined size by a cutter 35, and is discharged to the outside of the printer through a discharge port 36.

A feed roller 14 contacts the outer peripheral surface of the roll 13 to draw a tip of the thermosensitive recording paper 12 toward a conveying path. A conveyor roller pair 16 nips the fed recording paper 12 and reciprocates the recording paper 12 in a forward direction and a backward direction. The feed roller 14 and the conveyor roller pair 16 are driven by a drive motor (not shown).

The thermosensitive recording paper 12 comprises a cyan thermosensitive coloring layer, a magenta thermosensitive coloring layer, and a yellow thermosensitive coloring layer, which are stacked on a support. The yellow thermosensitive coloring layer is the uppermost layer and has the highest thermal sensitivity so as to color in yellow with small thermal energy. The cyan thermosensitive coloring layer is the lowermost layer and has the lowest thermal sensitivity so as to color in cyan with great thermal energy. The yellow thermosensitive coloring layer loses an ability to color when near ultraviolet rays of 420 nm is applied thereto. The magenta thermosensitive coloring layer colors in magenta with thermal energy intermediate between those for the yellow and cyan thermosensitive coloring layers and loses an ability to color when ultraviolet rays of 365 nm is applied thereto. The color thermosensitive recording paper 12 may have a four-layer structure by providing a black thermosensitive coloring layer.

A thermal head 20 is disposed at a downstream side of the conveyor roller pair 16 in the forward direction. The thermal head 20 includes a heating element array 22 in which a large number of heating elements align in a scanning direction. The thermal head 20 thermally records the respective color images sequentially, such that the respective thermosensitive coloring layers are heated in sequentially by the heating element array 22 contacting to a recording surface of the thermosensitive recording paper 12.

A platen roller 21 is disposed on a position confronting the thermal head 20, and supports the recording paper 12 which is pushed by the thermal head 20, from back side thereof. The platen roller 21 is moved by a shifting mechanism (not shown), between a nipping position for nipping the recording paper 12 with the thermal head 20, and a retreat position for making a gap between the thermal head 20. At initial state, the platen roller 21 is at the retreat position, and the recording paper 12 is fed in this state.

The fed recording paper 12 is conveyed in the forward direction until the whole recording area for one image passes the thermal head 20. Then the thermosensitive recording paper 12 is thermally recorded by the thermal head 20, with being conveyed in the backward direction by the conveyor roller pair 16.

An optical fixing unit 25 is disposed at a downstream side of the thermal head 20 in the forward direction. The optical fixing unit 25 comprises a light emitting element array 26 for yellow and a light emitting element array 27 for magenta. The light emitting element array 26 for yellow emits the near ultra-violet rays whose luminescent peak is 420 nm, for fixing the yellow thermosensitive coloring layer. And the light emitting element array 27 for magenta emits the ultra-violet rays whose luminescent peak is 365 nm, for fixing the magenta thermosensitive coloring layer. The thermosensitive recording paper 12 on which the image of the one color is thermally recorded is fed in the forward direction toward the optical fixing unit 25. The optical fixing unit 25 emits the fixing light, according to the color being recorded, toward the recording paper 12 passing under the luminescent surface of the optical fixing unit 25.

Figure 2:
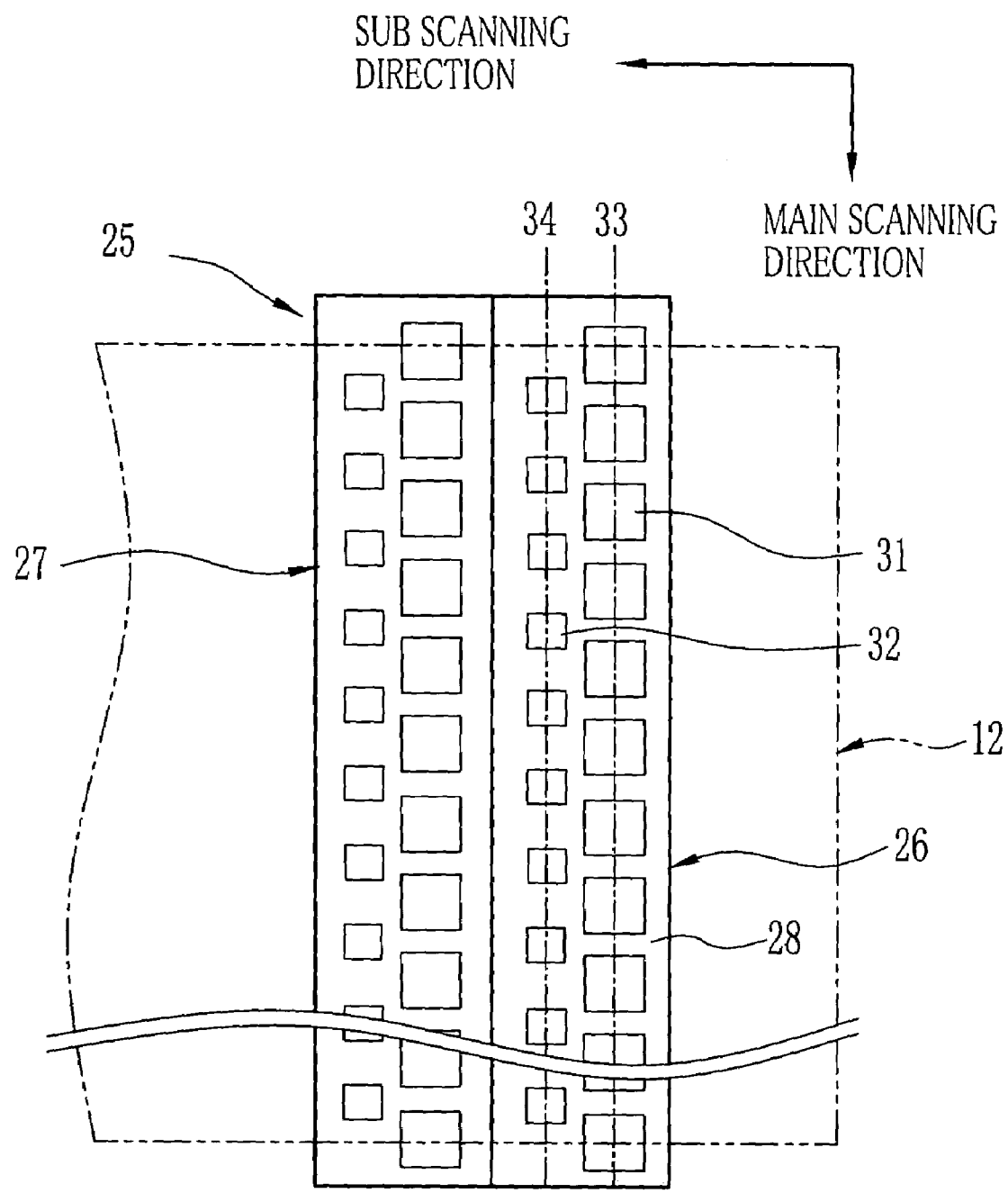
FIG. 2 is an explanatory illustration showing a structure of an optical fixing unit of a first embodiment.

As shown in FIG. 2, in the light emitting element array 26 for yellow, large light emitting elements 31 and small light emitting elements 32, which have different luminescent areas, are arranged on a substrate 28 in a matrix-like form. LED chips which are chip-type light emitting elements without lead sections are used as the respective light emitting elements 31, 32. A main luminous line 33 is a line on which the plural large light emitting elements 31 are arranged in series along the scanning direction. And a sub luminous line 34 is the other line on which the plural small light emitting elements 32 are arranged in series along the scanning direction.

Figure 3A:
FIG. 3A shows distribution of light quantity of the light emitting element array for yellow.
Figure 3B:
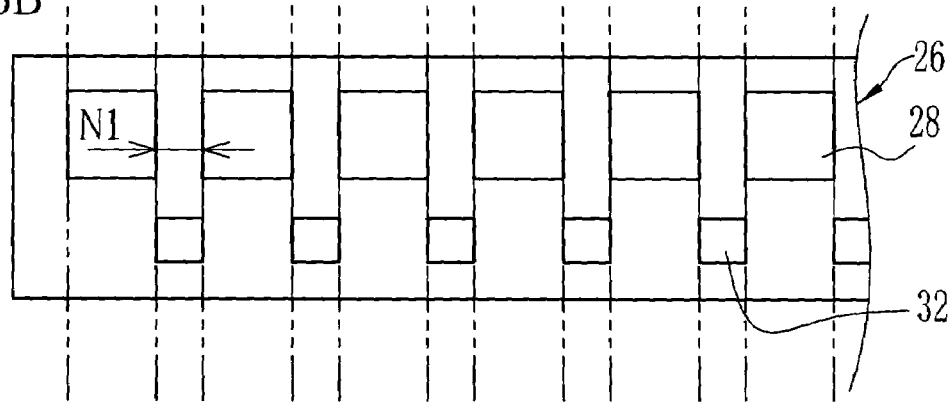
FIG. 3B shows an arrangement of large light emitting elements and small light emitting elements in the light emitting element array for yellow.

As shown in FIG. 3B, the large light emitting element 31 is the chip which has the same luminescent area of about 1 mm square as the conventional light emitting element has. There is a clearance N1 of about 0.5 mm between each of the large light emitting elements 31 for connection to the substrate 28, and so on. The small light emitting element 32 is the chip which has the luminescent area of about 0.5 mm square, such that the width thereof in the scanning direction approximately corresponds to the length of the clearance N1. Each of the small light emitting elements 32 is disposed at a position corresponds to each clearance N1 as a sub luminous section, to correct uneven distribution of light quantity of the main luminous line 33 in the scanning direction caused by each of the clearance N1.

Figure 3C:
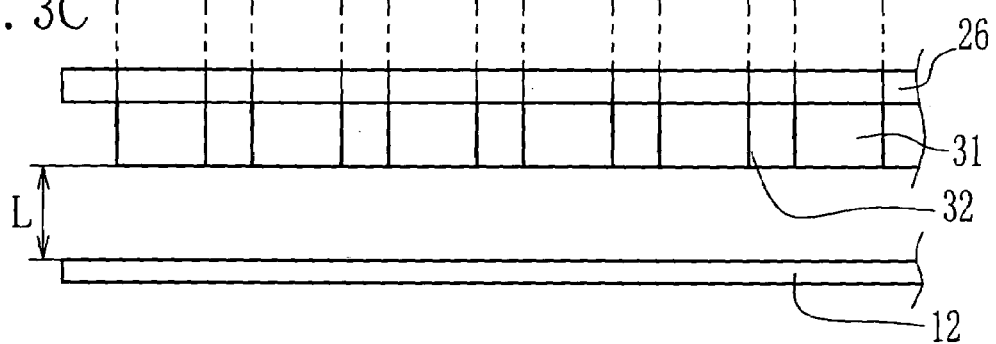
FIG. 3C shows a clearance L between the light emitting element array for yellow and a thermal recording paper.

This arrangement of the light emitting elements diminishes the portions where the light emitting elements of the adjacent lines are overlapped in the scanning direction, comparing to the conventional arrangement to put the light emitting elements of same size in a zigzag. Accordingly, even if a clearance L between the luminescent surface of the light emitting element array 26 and the recording surface of the thermosensitive recording paper 12 becomes about 10 mm as shown in FIG. 3C, the even distribution of light quantity of the light emitting element array 26 in the scanning direction can be maintained as shown in FIG. 3A.

Although the single main luminous line 33 is provided in this embodiment, plural main luminous line 33 can be provided. The sub luminous line 34 is provided to every single main luminous line 33, therefore the number of the sub luminous line 34 corresponds to the number of the main luminous line 33, when plural main luminous lines 33 are provided. In this case, it is preferable that the main luminous line 33 and the sub luminous line 34 are arranged alternately.

The light emitting element array 27 for magenta has a similar structure to the light emitting element array 26 for yellow. Therefore a description concerning the light emitting element array 27 for magenta is abbreviated.

An operation of the above-described structure is explained below. After the thermosensitive recording paper 12 is fed, the thermal head 20 thermally records the yellow image on the recording paper 12 being conveyed in the backward direction. After thermal recording, the light emitting element array 26 for yellow is turned on to optically fix the yellow image on the recording paper 12 being conveyed in forward direction. The clearance L between the light emitting element array 26 for yellow and the thermosensitive recording paper 12 is about 10 mm, which is narrower than the conventional manner. Accordingly, time for fixation becomes short because of increased illumination intensity. And illumination efficiency and energy efficiency can be enhanced by the narrower clearance L. In addition, the unevenness of fixation does not occur because there is no uneven distribution of light quantity in the scanning direction.

After the fixing of the yellow image is finished, the thermal head 20 thermally records the magenta image on the recording paper 12 being conveyed in the backward direction again. After thermal recording, the light emitting element array 27 for magenta is turned on to optically fix the magenta image on the recording paper 12 being conveyed in forward direction. Because the light emitting element array 27 for magenta has the similar structure to the light emitting element array 26 for yellow, the magenta image is fixed efficiently and evenly in the scanning direction. After the fixing of the magenta image is finished, the cyan image is thermally recorded on the recording paper 12, and then the printed recording paper 12 is cut by a cutter 35, and is discharged to the outside of the printer.

Figure 4:
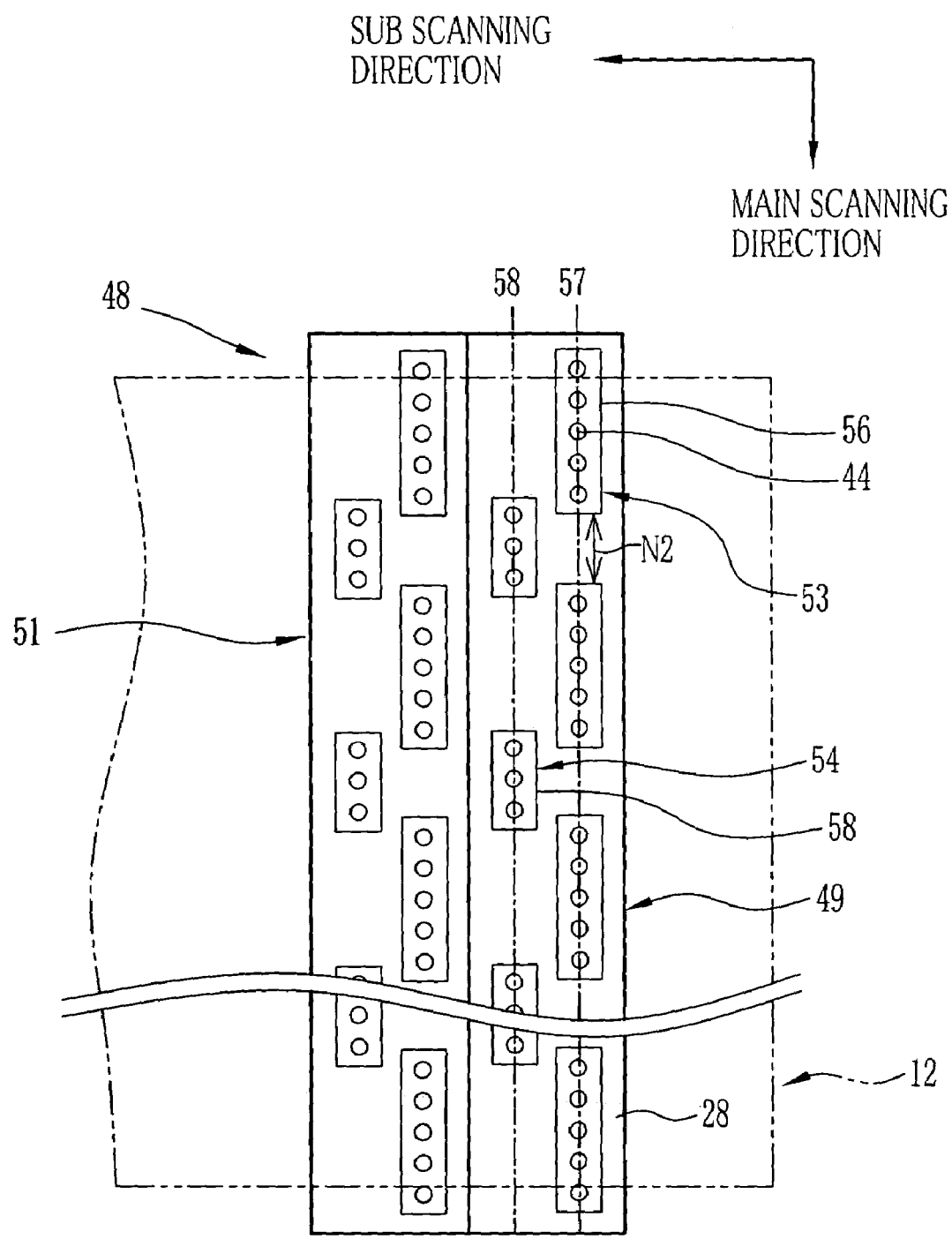
FIG. 4 is an explanatory illustration showing a structure of an optical fixing unit of a second embodiment.

Now a second embodiment of the present invention is explained. As shown in FIG. 4, an optical fixing unit 48 comprises a light emitting element array 49 for yellow and a light emitting element array 51 for magenta. In the light emitting element array 49 for yellow, large light emitting element modules 53 and small light emitting element modules 54, which have different areas, are arranged on the substrate 28. The large light emitting element module 53 is formed such that five light emitting elements 44 for yellow are arranged in one line in a case 58. A main luminous line 57 is a line on which plural large light emitting element modules 53 are arranged so as to orient an arranging direction of the light emitting elements 44 to the scanning direction. There are clearances N2 between the large light emitting element modules 53 for connection and so on.

The small light emitting element module 54 is formed such that three light emitting elements 44 are arranged in one line in the case 58. A sub luminous line 58 is the other line on which the plural small light emitting element modules 54 are arranged so as to orient the arranging direction of the light emitting elements 44 to the scanning direction. The small light emitting element module 54 has the width in the scanning direction approximately corresponds to the length of the clearance N2, and disposed at a position corresponds to the each clearance N2 as the sub luminous section. Although the five light emitting elements 44 are arranged in the single large light emitting element modules 53, the number of light emitting elements 44 arranged in the one large light emitting element modules 53 may be changed. In addition, the number of light emitting elements 44 in the single small light emitting element modules 54 may be determined in accordance with the length of the clearance N2.

According to this arrangement, portions where the large light emitting element modules 53 and the small light emitting element modules 54 overlap each other in the scanning direction becomes small, because the small light emitting element module 54 is disposed to fill the clearance N2 between each of the large light emitting element module 53. Therefore, the even distribution of light quantity of the light emitting element array 49 for yellow in the scanning direction can be obtained. The light emitting element array 51 for magenta has a similar structure to the light emitting element array 49 for yellow. Therefore, a description concerning the light emitting element array 27 for magenta is abbreviated.

In the second embodiment, the module including the plural light emitting elements is a minimum unit. Accordingly, the clearance between the each light emitting element becomes larger than the first embodiment in which each light emitting element is the minimum unit. Therefore, the clearance between the light emitting element array 49 for yellow and the thermosensitive recording paper 12 needs to be wider in comparison with the first embodiment. However, because this arrangement has the smaller overlapping portions than the conventional arrangement to put the light emitting elements of same size in the zigzag form, the light emitting element arrays of the embodiment can be positioned more closer to the thermosensitive recording paper than that of the conventional manner, maintaining the even distribution of light quantity in the scanning direction. Therefore, the illumination efficiency and the energy efficiency can be enhanced, and the time for fixation can become short.

In the above embodiments, the sub luminous section consists of the one small light emitting element or small light emitting element module. However, as shown in FIG. 5, the sub luminous section may consists of plural small light emitting elements or small light emitting element modules according to the length of the clearances N1, N2 on the main luminous lines.

Figure 5A:
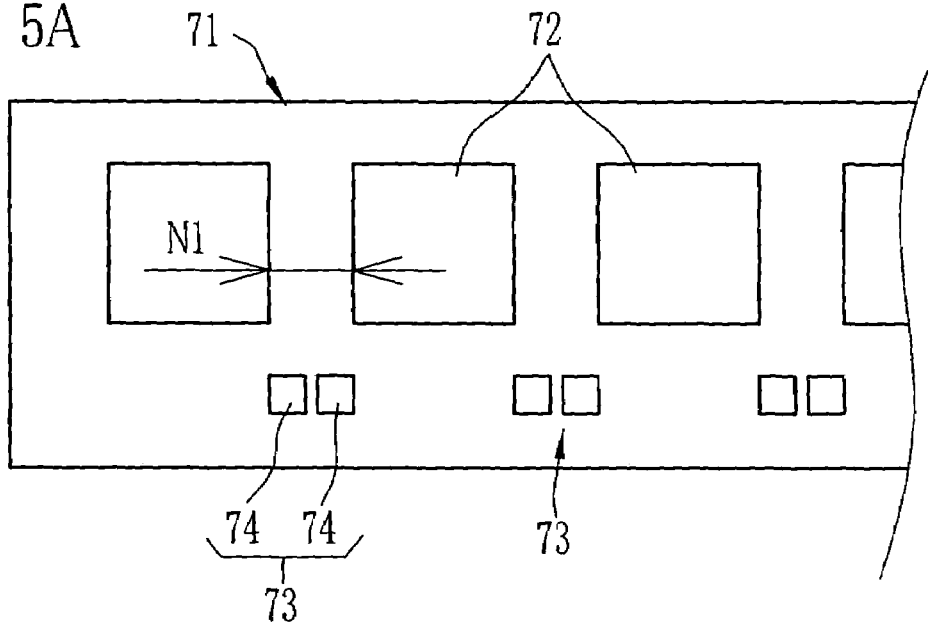
FIG. 5A shows a sub luminous section consisting of two small light emitting elements.
Figure 5B:
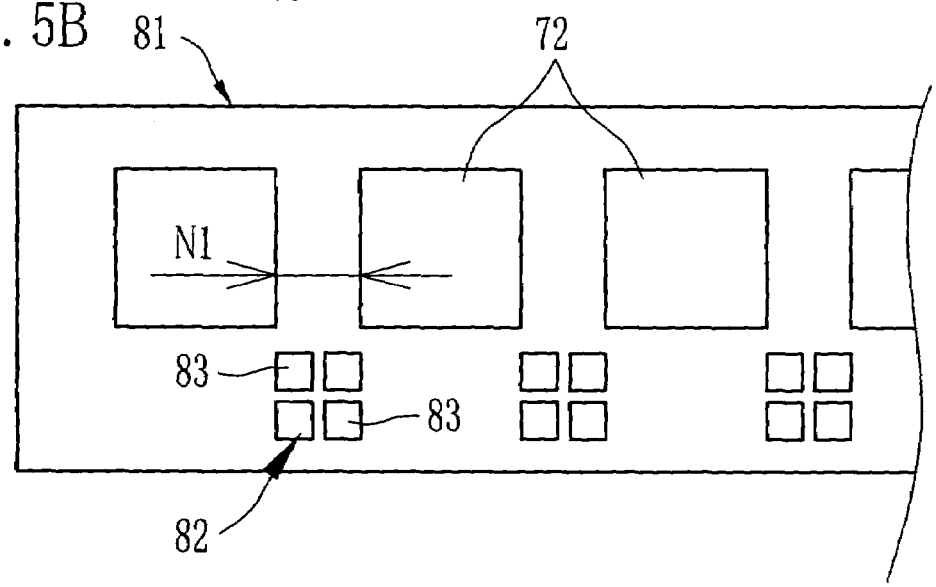
FIG. 5B shows a sub luminous section consisting of four small light emitting elements.
Figure 5C:
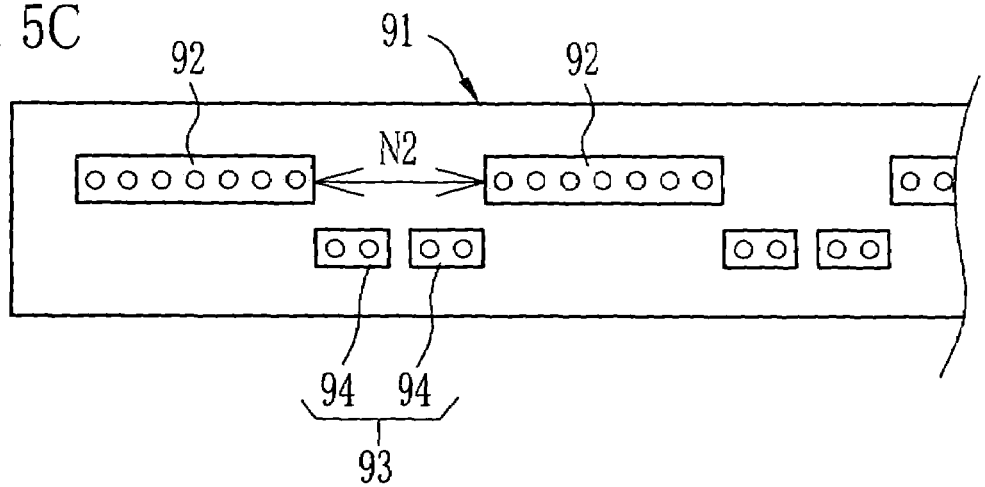
FIG. 5C shows a sub luminous section consisting of two small light emitting element modules.
Figure 6A:
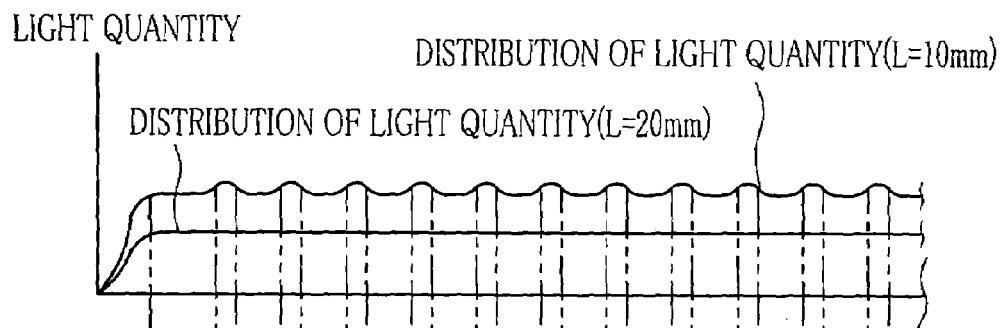
FIG. 6A shows distribution of light quantity of the light emitting element array.
Figure 6B:
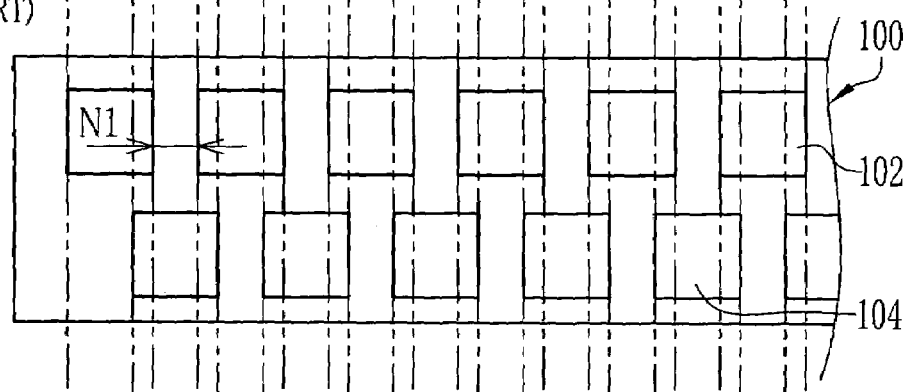
FIG. 6B shows an arrangement of light emitting elements in the light emitting element array.
Figure 6C:
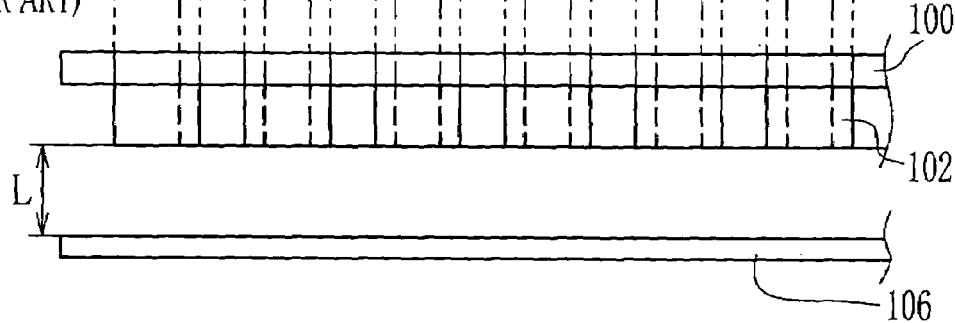
FIG. 6C shows a clearance L between the light emitting element array and a thermal recording paper.

For example, in a light emitting element array 71 shown in FIG. 5A, a sub luminous section 73 consists of two small light emitting elements 74. And in a light emitting element array 81 shown in FIG. 5B, a sub luminous section 82 consists of four small light emitting elements 83. In addition, in a light emitting element array 91 shown in FIG. 5C, a sub luminous section 93 corresponding to the clearance N2 between each large light emitting element modules 92 consists of two small light emitting element modules 94.

In the above embodiment, the light emitting device of the present invention is applied to the optical fixing unit. However, the present invention is not limited to the optical fixing unit, and may be applied to other types of the light emitting device such as an illumination device for forming a pattern on a print substrate. The wavelength of the light emitted from the light emitting elements is selected in accordance with the use of the light emitting device.

Although the present invention has been fully described by way of the preferred embodiments thereof with reference to the accompanying drawings, various changes and modifications will be apparent to those having skill in this field. Therefore, unless otherwise these changes and modifications depart from the scope of the present invention, they should be construed as included therein.

What is claimed is:

1. A light emitting device having luminescent area lengthened in a first direction, and emitting light toward a photosensitive material relatively moving in a second direction which is approximately perpendicular to said first direction, comprising:

at least one main luminous line on which plural large light emitting elements having large luminescent area are arranged in one line along said first direction; and a sub luminous section having at least one small light emitting element having smaller luminescent area than said large light emitting element and being disposed close to said main luminous line, at a position corresponding to a clearance between said large light emitting elements in said first direction.

2. A light emitting device according to claim 1, wherein said sub luminous section has the length approximately equal to the length of said clearance in said first direction.

3. A light emitting device according to claim 2, wherein said sub luminous section is a single piece of said small light emitting element, and a plurality of said small light emitting elements are arranged in series along said first direction to form a sub luminous line.

4. A light emitting device according to claim 3, wherein said luminescent surface of said large light emitting element is about 1 mm square, said clearance is 0.5 mm, and said luminescent surface of said small light emitting element is 0.5 mm square.

5. A light emitting device according to claim 4, a clearance between a luminescent surface of said light emitting element array and a recording surface of said photosensitive material is 10 mm.

6. A light emitting device according to claim 5, wherein said first direction is a scanning direction, said second direction is a sub scanning direction, said photosensitive material is a thermosensitive recording material on which thermal recording is already carried out, and said light emitting device performs optical fixation by emitting ultraviolet rays onto said thermosensitive recording material.

7. A light emitting device according to claim 6, wherein said large light emitting element and said small light emitting element are LED chips.

8. A light emitting device according to claim 2, wherein said sub luminous section consists of said plural small light emitting elements arranged in said first direction.

9. A light emitting device according to claim 2, wherein said sub luminous section consists of said plural small light emitting elements arranged in said first direction and said second direction.

10. A light emitting device having luminescent area lengthened in a first direction, and emitting light toward a photosensitive material relatively moving in a second direction which is approximately perpendicular to said first direction, comprising:

at least one main luminous line, on which plural large light emitting element modules including plural light emitting elements arranged therein to be large in luminescent area are arranged in one line along said first direction; and a sub luminous section having at least one small light emitting element module including a plurality of said light emitting elements arranged therein to be smaller in luminescent area than said large light emitting element module and being disposed close to said main luminous line, at a position corresponding to a clearance between said large light emitting element modules in said first direction.

11. A light emitting device according to claim 10, wherein said sub luminous section has the length approximately equal to the length of said clearance in said first direction.

12. A light emitting device according to claim 11, wherein said sub luminous section is a single piece of said small light emitting element module, and a plurality of said small light emitting element modules are arranged in series along said first direction to form a sub luminous line.

13. A light emitting device according to claim 11, wherein said sub luminous section consists of said plural small light emitting element modules arranged in said first direction.

* * * * *